United States Patent [19]
Bernitt

[11] 4,224,578
[45] Sep. 23, 1980

[54] GAIN CONTROL

[75] Inventor: Jürgen Bernitt, Wankendorf, Fed. Rep. of Germany

[73] Assignee: Dr.-Ing. Rudolf Hell GmbH, Postfach, Fed. Rep. of Germany

[21] Appl. No.: 942,041

[22] Filed: Sep. 13, 1978

[30] Foreign Application Priority Data

Sep. 17, 1977 [DE] Fed. Rep. of Germany ....... 2741952

[51] Int. Cl.³ ............................................ H03G 3/20
[52] U.S. Cl. .................................. 330/138; 330/129; 330/141; 330/279; 330/280; 330/281
[58] Field of Search ............... 330/129, 138, 141, 279, 330/280, 281, 282

[56] References Cited
U.S. PATENT DOCUMENTS 3,879,672  4/1975  Milanes ........................... 330/129 X Primary Examiner—James B. Mullins
Attorney, Agent, or Firm—Ernest F. Marmorek

[57] ABSTRACT

A regulation device for controlling the level of a signal having a controllable amplification, the signal fluctuating in amplitude, includes a signal control device, first and second threshold stages postcoupled to the signal control device having first and second thresholds, respectively, which thresholds define a predetermined signal range, and an element chargeable and dischargeable to first and second potentials, respectively, postcoupled to the threshold device, and connected by feedback to the signal control device for controlling its amplification within the predetermined range.

10 Claims, 4 Drawing Figures

GAIN CONTROL

BACKGROUND OF THE INVENTION

When transmitting amplitude and/or phase modulated signals, it is known to provide the receiver with a gain or level regulating device, which equalizes or smoothes any fluctuation in the level of the signal occurring during transmission. For this purpose, a capacitor is charged to respective peak values of the signal, an increasing voltage across the capacitor being utilized to decrease the amplification of a pre-amplifier, and therefore to decrease the level of the signal, while a decreasing potential across the capacitor is utilized to increase the amplification of the pre-amplifier, and thus to increase the level of the signal.

To prevent changing the amplification of the signal continuously in the pre-amplifier, the gain control only takes effect, once a predetermined threshold potential across the capacitor has been exceeded.

In the transmission of images of a carrier modulated by amplitude and phase modulation, overshoots may, however, occur in the transmitted signal during phase changes, which in turn lead to a drastic reduction of the amplification, for example, of the pre-amplifier. This in turn leads to an undesirable decrease of the level of the signal, particularly if such phase changes or phase jumps occur frequently.

SUMMARY OF THE INVENTION

It is accordingly one of the principal objects of the present invention to devise a circuit for an improved gain or level control of the signal, which prevents such undesirable fluctuations.

This object is attained, by providing a regulation device for controlling the level of the signal fluctuating in amplitude which includes signal control means having a controllable amplification, a first threshold stage having a predetermined signal threshold, and a second threshold stage having a second predetermined signal threshold exceeding the first predetermined signal threshold. The thresholds define a predetermined signal range, and the threshold stages are postcoupled to the signal control means. Additionally, means chargeable to a first potential, and dischargeable to a second potential, are postcoupled to the threshold stages, and connected by feedback to the signal control means for controlling the amplification thereof in the predetermined signal range, so that an increase of the signal will decrease the amplification of the signal control means, while a decrease of the signal will increase the amplification of the signal control means. The chargeable means is preferably a capacitor having two terminals. In a preferred embodiment of the invention, inhibiting and enabling means are provided for selectively inhibiting and enabling the controllable amplification of the signal control means.

It is advantageous if an inverter is postcoupled to the second threshold stage, and an AND-gate having a first input is coupled to the first threshold stage, and a second input of the AND-gate is coupled to the inverter; the output of the AND-gate is coupled to one terminal of the capacitor, and the other terminal of the capacitor is coupled to the signal control means.

The AND-gate is preferably provided with an additional input, and it is advantageous to provide enabling means coupled to the additional input for enabling the AND-gate.

The enabling means preferably include a filter tuned to a carrier frequency, so that a signal including the carrier frequency passing through the filter, enables the AND-gate.

It is advantageous if the AND-gate has input means for accepting a "ready-to-receive" signal.

The signal may include information subdivided into a plurality of successive lines, and information pertaining to the phase of the carrier, the phase information being transmitted between two successive lines. In such a case, it is advantageous to provide an AND-gate which has two inputs and an output, so that the phase information may be received by one input, and the second threshold stage may be coupled to the other input. It is then advantageous to provide an AND-gate which has a first input coupled to the first threshold stage, a second input coupled to the output of the AND-gate, and an output coupled to one terminal of the capacitor, the other terminal of the capacitor then being coupled to the signal control means.

It is advantageous to provide the AND-gate with input means for receiving an enabling signal; the enabling signal may be a program-enabling signal.

It is advantageous to provide a resistor of relatively high ohmic value connected to the output of the AND-gate, and to the one terminal of the capacitor, a resistor of relatively low ohmic value connected with one terminal thereof to the output of the AND-gate, and to the resistor of relatively high ohmic value, while its terminal may be connected to a source of supply current, and rectifying means shunted across the relatively high ohmic value resistor at a polarity, so that a charging current from the supply source may be fed to the capacitor.

It is advantageous to provide an operational amplifier which has an input connected to the one terminal of the capacitor, to the resistor of relatively high ohmic value, and to the rectifying means, and which has an output connected to the signal control means. The ratio of the resistors is preferably about 100:1.

BRIEF DESCRIPTION OF THE DRAWINGS

For a fuller understanding of the nature and objects of the invention, reference should be had to the following detailed description, taken in connection with the accompanying drawings, in which.

DESCRIPTION OF THE PREFERRED EMBODIMENTS

Figure 1:
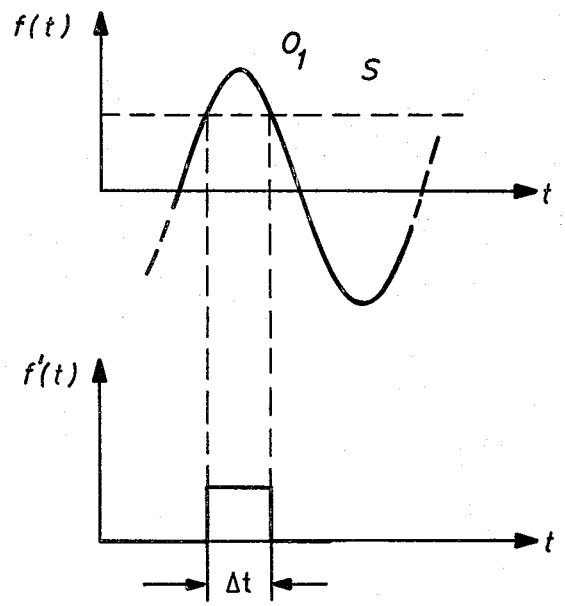
FIG. 1 shows a pictorial representation of the control voltage in a gain regulation device of the prior art.

In carrying the invention into effect, FIG. 1 shows as a function f(t), a so-called overshoot device $O_1$, which exceeds a threshold value S, and upon exceeding this threshold value S, begins, as has already been stated, to charge a capacitor C. This charging voltage is shown schematically as f'(t) of a duration $\Delta(t)$, and it will be understood that the capacitor is charged during the whole time Δ(t), so that the level of the signal is considerably reduced by the regulation device.

Figure 2:
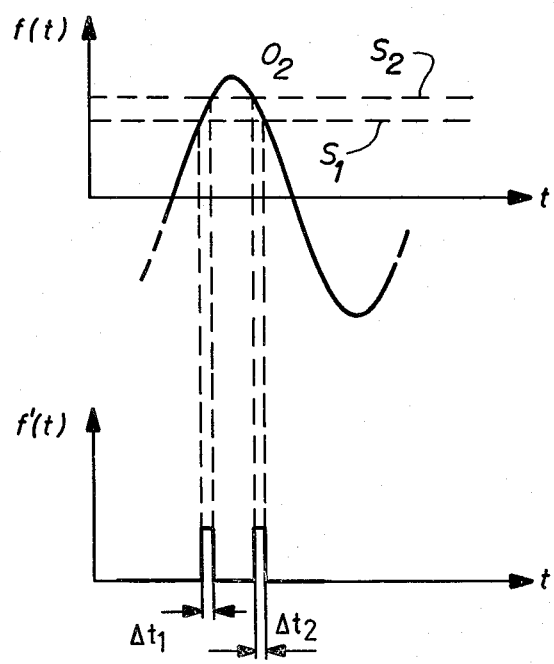
FIG. 2 shows a pictorial representation of the voltage in a gain regulation device, according to the present invention.

FIG. 2 also shows as a function U=f(t) an overshoot of the signal U, which is given on two threshold stages having the threshold values $S_1$, and $S_2$. The threshold value $S_1$ corresponds to the threshold value S, of FIG. 1. The threshold stages are, as will be described later in relation to FIG. 3, logically so connected, that the capacitor is only charged within the region between the threshold values $S_1$ and $S_2$. This in turn leads to the schematically illustrated impulses f'(t), which have the respective durations $\Delta t_1$, and $\Delta t_2$. These impulses also charge the capacitor, but, as will be understood, not to the same extent as the impulse of duration t, shown in FIG. 1, for which reason the control voltage is not decreased so much.

Figure 3:
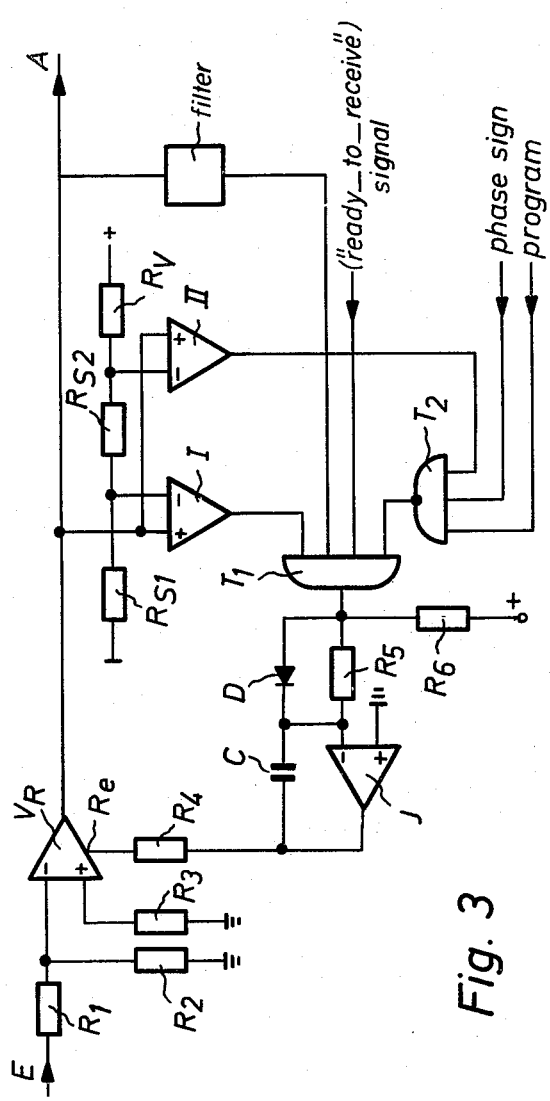
FIG. 3 is a block schematic diagram, according to the present invention.

FIG. 3 shows a block diagram of a gain regulation device. From the input A, which may be an antenna, or a transmission line, an amplitude- or phase-modulated carrier signal is fed via a potential divider $R_1$, $R_2$, to the minus input of a control amplifier $V_R$, the plus input of which is connected to ground via a resistor $R_3$. The amplifier $V_R$ is provided with a control input $R_E$, to which a control potential is fed. From the output of the amplifier $V_R$, the signal is fed to the plus inputs of two threshold stages I, and II. The threshold values of the threshold stages I and II are determined by the resistors $R_{S1}$, $R_{S2}$, and $R_V$, which form a voltage or potential divider between a constant supply source and ground. The minus input of the threshold stage I is connected to the junction of the resistors $R_{S1}$ and $R_{S2}$, and the minus input of the threshold stage II is connected to the junction of the resistors $R_{S2}$, and $R_V$. The resistors $R_{S1}$, $R_{S2}$, and $R_V$, are connected in series; one terminal of the resistor $R_V$ is connected, in the example shown, to the supply source, while the terminal of the resistor $R_{S1}$ not connected to the threshold stages, is connected to ground.

In the simplest version of the present invention, the output of the threshold stage I is connected to an AND-gate $T_1$, which AND-gate $T_1$ is in turn connected to a minus input of an integrator via a resistor $R_5$, the integrator including an operational amplifier J, and a capacitor C connected in feedback connection thereacross. The output of the integrator, which functions as the initially described charging capacitor, is connected to the control input $R_E$ of the control amplifier $V_R$. The AND-gate $T_1$ has four inputs, but in the simplest version, may only be provided with two inputs, in which case the first input is, as has already been stated, connected to the output of the first threshold amplifier I, while the second input may be connected to the output of the second threshold stage II, via an inverter, such as a NAND-gate $T_2$; or alternatively, the AND-gate $T_1$, may have an input which inverts a signal fed thereto, prior to being processed by the AND-gate proper. In order to avoid an unnecessary number of figures in illustrating such variations of the circuit, the circuit has been illustrated in only one version, the other versions being simply obtained by omitting appropriate inputs.

In the case of FIG. 2 an increasing signal may exceed the threshold value $S_1$, without, however, having reached yet the threshold value $S_2$. In this case, the threshold stage I has an H signal as an output, while the threshold stage II has a signal L as an output, which is in turn inverted to a signal H, and then enables the AND-gate $T_1$. The AND-gate $T_1$ is connected to the minus input of an operational amplifier J, via a resistor $R_5$, and a diode D shunted thereacross. Additionally, a resistor $R_6$ is connected with one terminal thereof to the output of the AND-gate $T_1$, and with the other terminal to a voltage source. The ratio of the resistors $R_5$, and $R_6$, is approximately 100:1.

If the AND-gate $T_1$ is enabled, then the output voltage of the integrator becomes more negative via the diode D and the relatively low-ohmic resistor $R_6$. This in turn causes the level of the signal appearing at the output of the amplifier $V_R$, to be reduced by the negative control voltage, appearing at its terminal $R_E$, fed thereto by the resistor $R_4$.

If the threshold values $S_1$ and $S_2$ are exceeded, the threshold stage $S_2$ has an H signal at its output, which is inverted to an L output, and inhibits the AND-gate $T_1$. In this case, a capacitor C is discharged via the resistor $R_5$, which resistor has a relatively high ohmic value, and the output voltage of the integrator J increases relatively slowly. The resultant increase in the level of the signal at the output of the amlifier $V_R$ can, therefore, be neglected. Depending on the particular choice of the circuit, according to FIG. 3, the AND-gate T, may have a plurality of inputs, and the output signal from the threshold stage $S_2$ may be inverted via an AND-gate $T_2$, which also may have a plurality of inputs. The AND-gate $T_1$ may receive on one of its inputs a "ready-to-receive" signal, which "ready-to-receive" signal has a value L, prior to transmission, and upon the device being ready to receive, an H signal is provided, thus enabling the gate $T_1$. Additionally, a signal may be fed to the AND-gate $T_1$, which signals the presence (H), or absence (L) of a carrier, which is obtained through a filter F, connected to the output of the amplifier $V_R$. Filters of this type are generally known, and the circuit is therefore not shown in further detail. It may, for example, be a resonant circuit allowing the carrier frequency to pass.

The NAND-gate $T_2$ may have additional inputs; one of these inputs may, for example, receive information pertaining to the phase of the carrier, such as whether the carrier is in phase with a reference signal, where the signal itself is sub-divided into a plurality of successive lines, while another input of the NAND-gate $T_2$ may receive a program enabling signal, which is generated prior to the transmission of the information-carrying signal.

Figure 4:
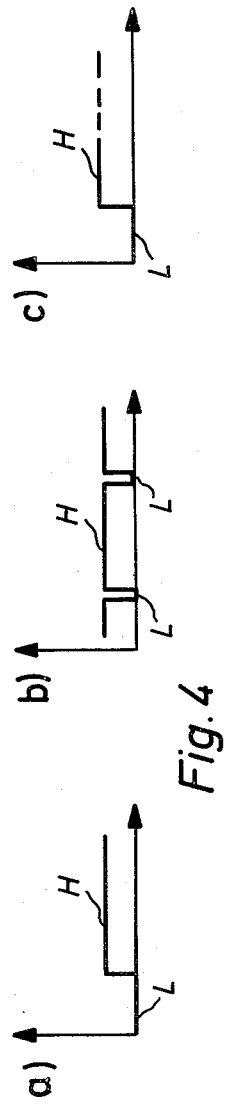
FIG. 4 shows additional graphs of voltages or currents used to control predetermined inputs of the control device, according to the present invention.

The additional signals are shown in FIGS. 4a, 4b, and 4c. The signal shown in FIG. 4a has a value L, prior to transmission, and when the device is "ready-to-receive", this changes to the value H, namely the threshold stage I may then pass the output through the AND-gate $T_1$.

The signal shown in FIG. 4b is transmitted in the interval occurring between two lines of the transmission according to the CCITT-standard. If the phase sign has the value L, then it is inverted via the NAND-gate $T_2$, and therefore, in effect, disconnects the threshold stage II.

The "program" signal shown in FIG. 4c, also transmitted according to the CCITT-standard, has the value L prior to transmission, and the value H during transmission, so that the threshold stage II is, in effect, disconnected in the event of a transmission of the signal "program".

The CCITT-standard is published in the Orange Book, volume II, Part III, Recommendations T3 and T30 of the International Telegraph and Telephone Consultive Committee, Telegraph Technique, International Telecommunication Union, Geneva 1977.

The circuit according to the present invention has the advantage, that once it is set according to a desired level value, it reacts to a relatively large level only, if that level falls within a predetermined tolerance range. The tolerance range is again defined by the two threshold values, which result in a "window discriminator". Thus, any overshoots, to the extent that they exceed the predetermined tolerance, no longer contribute to any change in the control potential.

Having thus described the invention, what I claim as new and desire to be secured by Letters Patent, is as follows:

1. A regulation device for controlling the level of a signal fluctuating in amplitude, comprising in combination:

signal control means having a controllable amplification, at least one input and one output, and inhibiting and enabling means for selectively inhibiting and enabling said controllable amplification, a first threshold stage having a first predetermined signal threshold, and having a first input, and a first output, a second threshold stage having a second predetermined signal threshold exceeding the first predetermined signal threshold, a second input, and a second output, the difference between said thresholds defining a predetermined signal range, said threshold stages being coupled to the output of said signal control means, an inverter postcoupled to said second threshold stage, means chargeable to a first potential, including a capacitor having two terminals, dischargeable to a second potential, postcoupled to the outputs of said threshold stages, and connected by feedback to said signal control means for controlling the amplification thereof within said predetermined signal range, the difference between said potentials being substantially linearly related to said predetermined signal range, and an AND gate having a first input coupled to said first threshold stage, a second input coupled to said inverter, and an output coupled to one terminal of said capacitor, the other terminal of said capacitor being coupled to said signal control means, whereby an increase of said signal substantially within said predetermined range will decrease the amplification of said signal control means, while a decrease of said signal substantially within said predetermined range will increase the amplification of said signal control means.

2. A regulation device according to claim 1, wherein said AND-gate has additional input means, and further comprising enabling means coupled to said additional input means for enabling said AND-gate.

3. A regulation device according to claim 2, wherein said enabling means includes a filter tuned to a carrier frequency from an external source, whereby a signal including said carrier frequency passing through said filter enables said AND-gate.

4. A regulation device according to claim 2, wherein said enabling means includes a "ready-to-receive" signal provided from an external source.

5. A regulation device according to claim 1, wherein the signal includes information subdivided into a plurality of successive lines and information pertaining to the phase of an external carrier, in relation to the phase of a reference signal, the phase information being transmitted between two successive lines, and further comprising a NAND-gate having two inputs and an output, the phase information being receivable by one NAND-gate input, the second threshold stage being coupled to the other NAND-gate input, and an AND-gate having a first input coupled to said first threshold stage, a second input coupled to the output of said NAND-gate, and an output coupled to one terminal of said capacitor, the other terminal of said capacitor being coupled to said signal control means.

6. A regulation device according to claim 5, wherein said NAND-gate includes input means for receiving an enabling signal.

7. A regulation device according to claim 6, wherein said enabling signal is a program- enabling signal.

8. A regulation device according to claim 1, further comprising a resistor of relatively high ohmic value connected to the output of said AND-gate and to said one terminal of said capacitor, a resistor of relatively low ohmic value connected with one terminal thereof to the output of said AND-gate and to said resistor of relatively high ohmic value, its other terminal being connectable to a source of supply current, and rectifying means shunted across said relatively high ohmic value resistor at a polarity so that a charging current from said supply source may be fed to said capacitor.

9. A regulation device according to claim 8, further comprising an operational amplifier having an input connected to said one terminal of said capacitor, to said resistor of relatively high ohmic value, and to said rectifying means, and having an ouput connected to said signal control means.

10. A regulation device according to claim 8, wherein the ratio of said resistors is about 100:1.

* * * * *